(12) United States Patent
Larson et al.

(10) Patent No.: US 6,559,733 B2
(45) Date of Patent: May 6, 2003

(54) REDUCING EFFECTS OF ELECTRICAL IMPEDANCE

(75) Inventors: Thane M. Larson, Roseville, CA (US); Andrew H. Barr, Roseville, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/923,735

(22) Filed: Aug. 6, 2001

(65) Prior Publication Data

US 2003/0025570 A1 Feb. 6, 2003

(51) Int. Cl.[7] .................................................. H01P 1/26
(52) U.S. Cl. ..................... 333/22 R; 333/32; 333/12; 333/81 A; 333/177; 361/502; 361/762; 361/760; 361/700; 361/772; 361/763
(58) Field of Search .................... 333/22 R, 12, 333/32, 177, 81 A; 361/502, 762, 760, 700, 772, 763

(56) References Cited

U.S. PATENT DOCUMENTS

| | | | | |
|---|---|---|---|---|
| 5,003,273 A | * | 3/1991 | Oppenberg | 333/1 |
| 5,612,657 A | * | 3/1997 | Kledzik | 333/247 |
| 5,898,576 A | * | 4/1999 | Lockwood et al. | 361/782 |
| 5,909,350 A | * | 6/1999 | Anthony | 333/182 |
| 5,912,809 A | * | 6/1999 | Steigerwald et al. | 361/780 |
| 6,104,258 A | * | 8/2000 | Novak | 333/22 R |
| 6,418,031 B1 | * | 7/2002 | Archambeault | 361/762 |

* cited by examiner

Primary Examiner—Michael Tokar
Assistant Examiner—Linh Van Nguyen
(74) Attorney, Agent, or Firm—Tuan V. Ngo

(57) ABSTRACT

The present invention, in various embodiments, provides techniques for reducing effects of electrical impedance. In one embodiment, the impedance is in the form of inductance and arises from vias in a termination PCB and from resistors used on the PCB. In one embodiment, a power plane is placed near the resistors. Additional power and ground planes are created in parallel among themselves and perpendicular to the vias, which cause capacitance to be formed between each pair of the ground and power planes, the ground planes and the vias, and the power planes and the vias. In one aspect, the power plane near the resistors and the formed capacitance allow the high-frequency returned currents to flow through a smaller loop and thus be affected by a smaller inductance. Additionally, the created capacitance reduces both the total impedance of the vias and the resistors and any impedance that result from power-ground discontinuity.

28 Claims, 13 Drawing Sheets

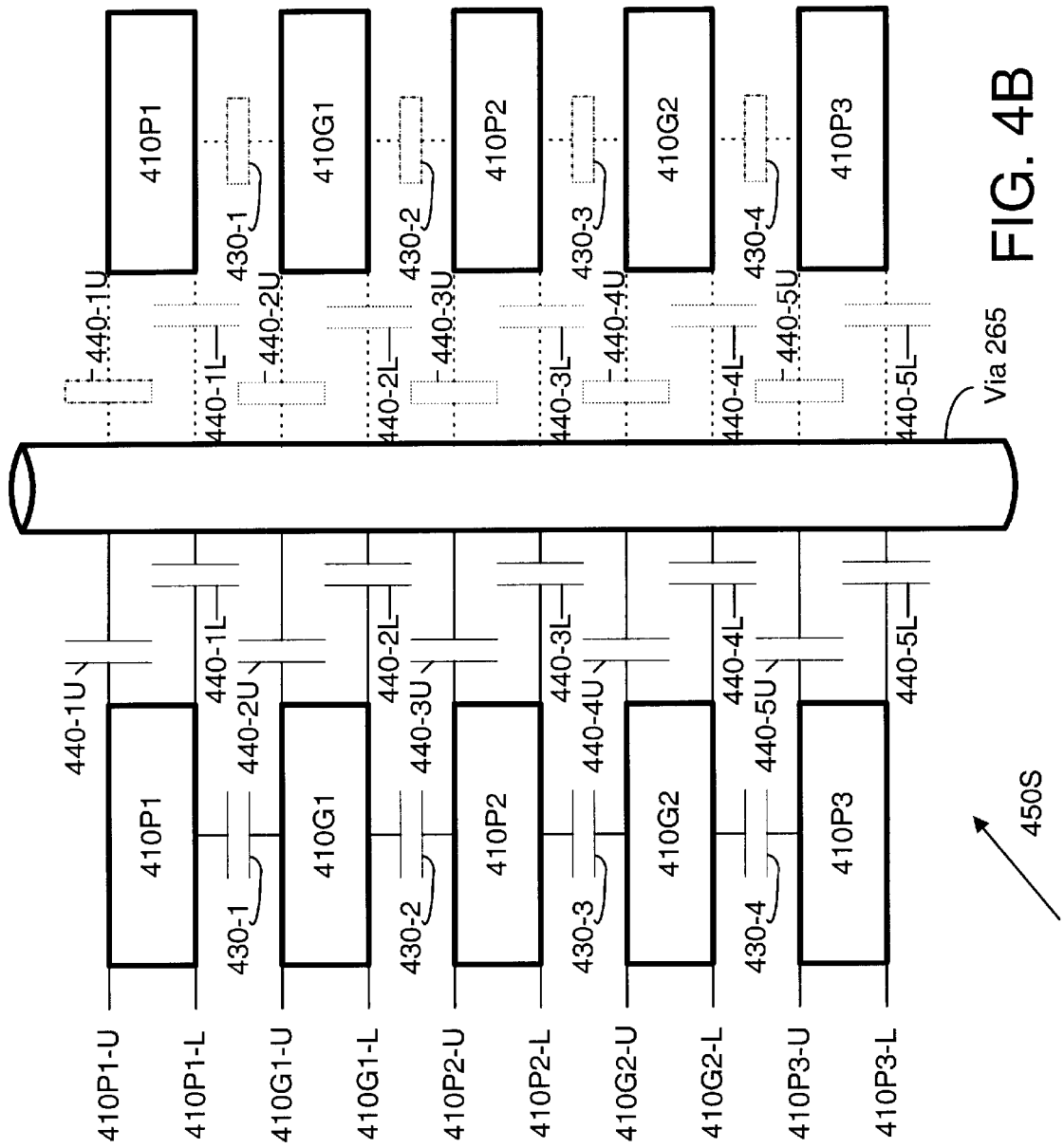

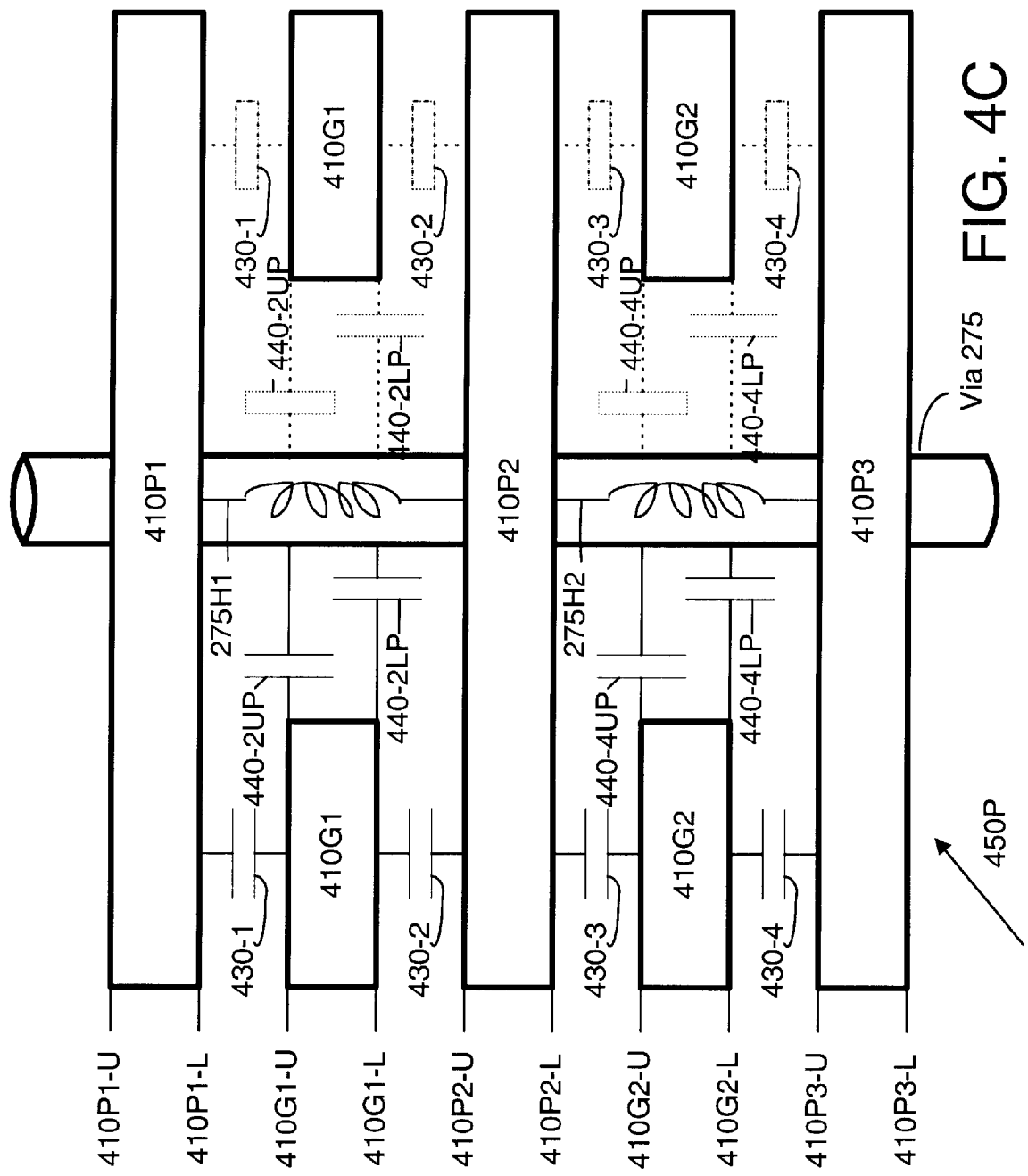

REDUCING EFFECTS OF ELECTRICAL IMPEDANCE

FIELD OF THE INVENTION

The present invention relates generally to signal integrity and, more specifically, to reducing the effects of electrical impedances.

BACKGROUND OF THE INVENTION

To terminate a high-speed electrical bus, dissipative components such as resistors having impedance matched to the impedance of the bus' transmission line are commonly used in series at the end of the bus. The matched impedance absorbs and thus reduces or eliminates signal reflections that bounce back on the bus to the signal source. However, if the end of the bus is connected to an active component, such as a processor, the active component itself can serve as a termination. When the active component is redundant, e.g., for improved performance or reliability, it is desirable to make that component optional.

To replace an optional component when it is removed from the system, one implementation uses a removable printed-circuit assembly (PCA) consisting of a printed-circuit board (PCB) upon which high-precision resistors are placed. PCBs usually include vias, which are conducting material in tunnel forms from one side of the PCB to the other side. On thin PCBs, vias are capacitive. However, on thick PCBs, vias behave as added electrical inductance, which, together with parasitic inductance from resistors used on the PCBs, can greatly affect circuits' performance.

When a signal flows through the vias and the resistors, the signal carries with it a current flow seeking to return to the original source driver that drives the signal. The current flowing through big loops of vias with high inductance can cause signal spikes and electrical crosstalk. Multiple signals intermingled with the returned current can also cause crosstalk.

A transmission line or an electronic component placed near a ground source (e.g., a ground line, a ground plane, etc.) is said to be referenced against ground. Similarly, the same transmission line or electronic component placed near a power source is said to be referenced against power. It is preferable that a signal flows through a path having components referenced against only one type of source, i.e., either power or ground, but not both. If a signal path having components referenced against both ground and power, then the high-frequency returned current experiences power-ground discontinuity, which can cause the "big loop" inductance effects discussed above because the current has to flow from power to ground in a longer path.

Based on the foregoing, it is desirable that mechanisms be provided to solve the above deficiencies and related problems.

SUMMARY OF THE INVENTION

The present invention, in various embodiments, provides techniques for reducing effects of electrical impedance. In one embodiment, the impedance is in the form of inductance and arises from vias in a termination PCB and from resistors used on the PCB. In one embodiment, a power plane is placed near the resistors. Additional power and ground planes are created in parallel among themselves and perpendicular to the vias, which cause capacitance to be formed between each pair of the ground and power planes, the ground planes and the vias, and the power planes and the vias.

In one aspect, the power plane near the resistors and the formed capacitance allow the high-frequency returned currents to flow through a smaller loop and thus be affected by a smaller inductance. Additionally, the created capacitance reduces both the total impedance of the vias and the resistors and any impedance that result from power-ground discontinuity.

DESCRIPTION OF THE DRAWINGS

The present invention is illustrated by way of example, and not by way of limitation, in the figures of the accompanying drawings in which like reference numerals refer to similar elements and in which:

FIG. 4B shows a portion 450S of the printed-circuit board in FIG. 4A;

FIG. 4C shows a portion 450P of the printed-circuit board in FIG. 4A;

DETAILED DESCRIPTION OF THE PREFERRED EMBODIMENT

The present invention, in various embodiments, provides techniques for reducing effects of electrical impedance. In one embodiment, the impedance is in the form of inductance and arises from vias in a termination PCB and from resistors used on the PCB. In the following description, for the purposes of explanation, numerous specific details are set forth in order to provide a thorough understanding of the present invention. However, it will be apparent to one skilled in the art that the invention may be practiced without these specific details. In other instances, well-known structures and devices are shown in block diagram form in order to avoid obscuring the invention.

System Overview

Figure 1:
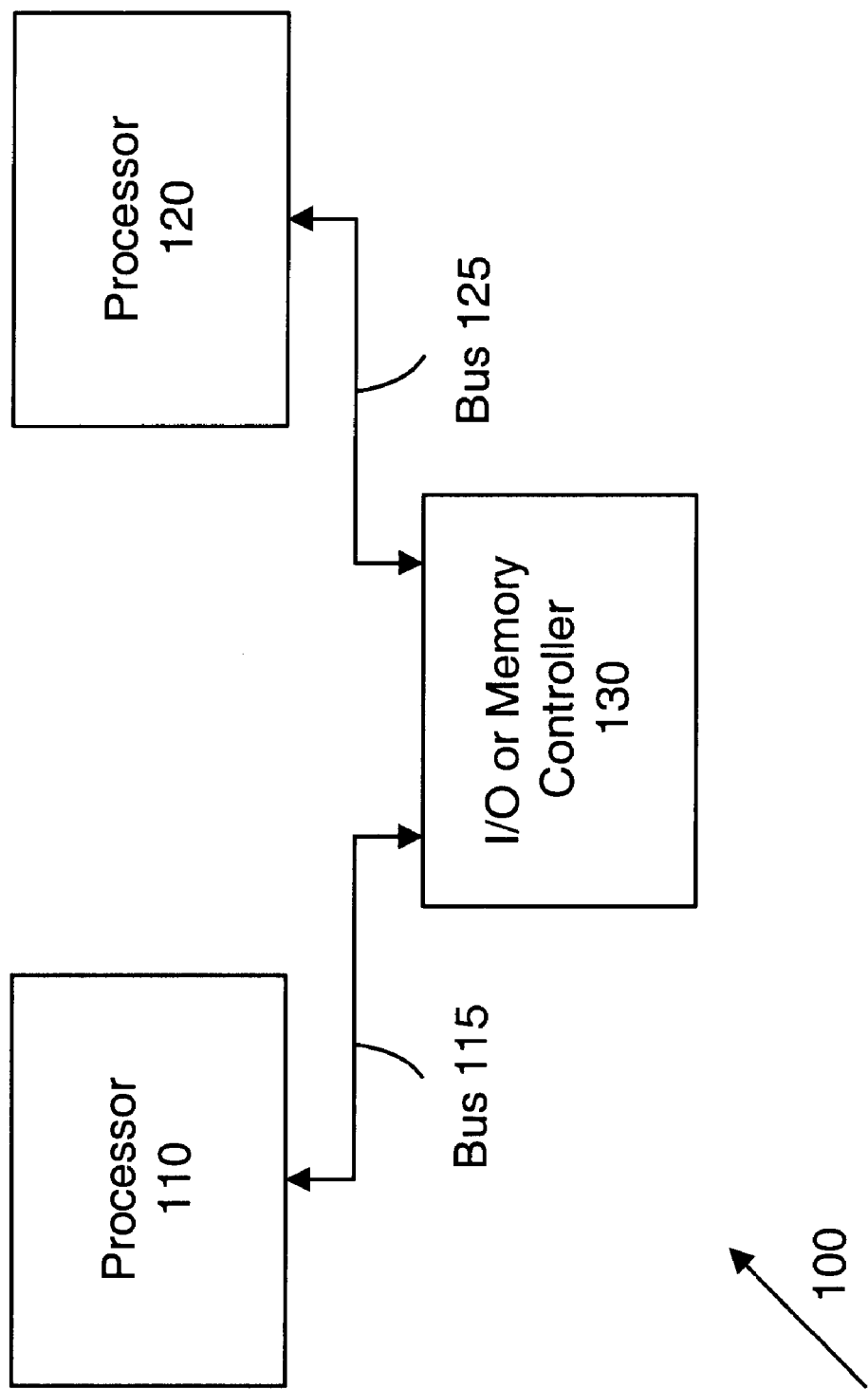
FIG. 1 shows a system upon which embodiments of the invention may be implemented.

FIG. 1 shows a system 100 upon which embodiments of the invention may be implemented. System 100 includes a first processor 110, a second processor 120, and an I/O and memory controller 130. Processor 110 communicates with controller 130 via bus 115 while processor 120 communicates with controller 130 via bus 125. In one embodiment, bus 115 and 125 act as a multi-drop processor-to-processor bus, and each processor 110 and 120 in system 100 serves as an electrical termination for signals traveling to that processor. For various reasons, each processor 110 or 120 may be removed from system 100, and it is desirable that a termination circuit is used in place of the removed processor.

The Equivalent Circuits

Figure 2A:
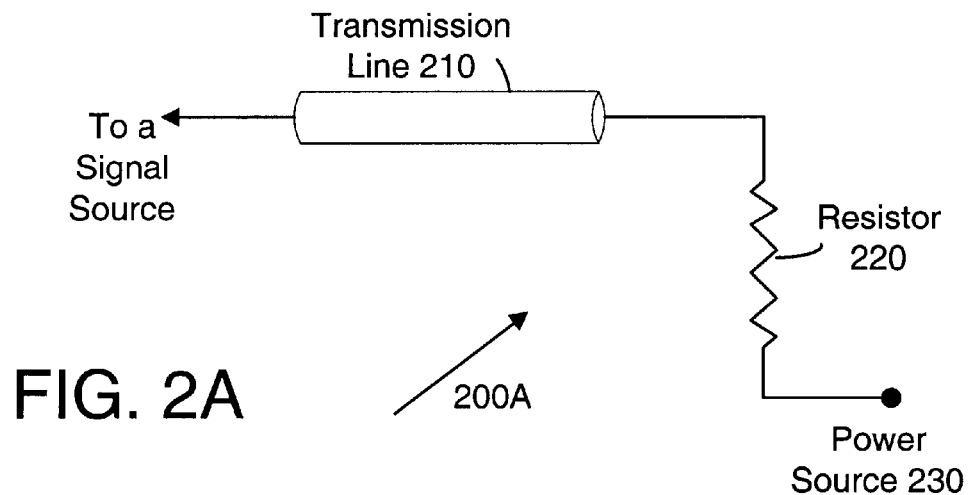
FIG. 2A shows a circuit representing bus 125 and processor 120 of FIG. 1.

FIG. 2A shows a circuit 200A representing bus 125 and a termination circuit used in place of a removed processor, e.g., processor 120. Circuit 200A includes a transmission line 210, a resistor 220, and a power source 230. In one embodiment, both transmission line 210 and resistor 220 are 50 Ohm, and power source 230 is at 1.5 V. Transmission line 210 represents bus 125, while resistor 220 and power source 230 represent the termination circuit.

Figure 2B:
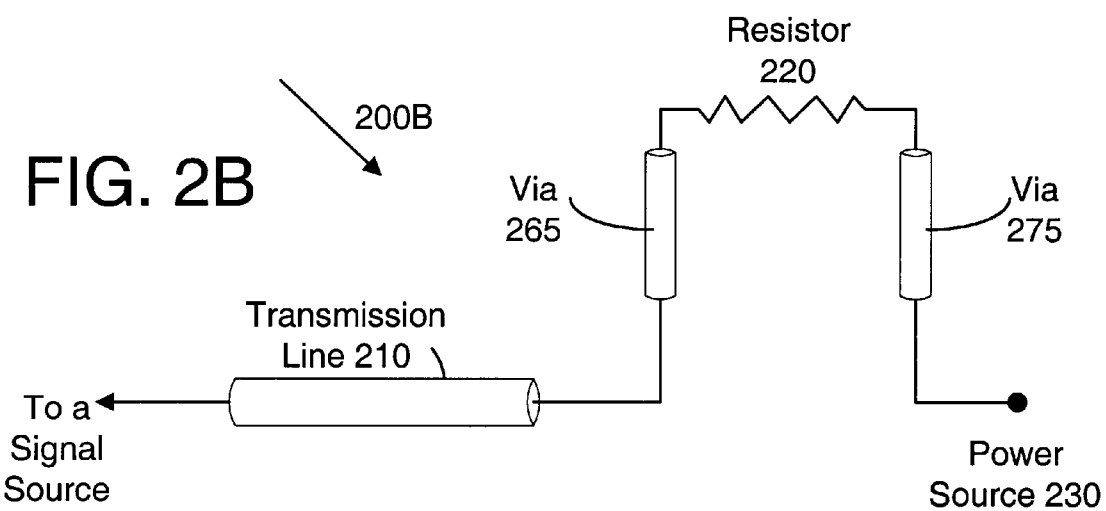
FIG. 2B shows an equivalent of the circuit in FIG. 2A in which vias in a printed-circuit board are used.

FIG. 2B shows a circuit 200B, which is equivalent to circuit 200A and in which vias on a printed-circuit board are used. As shown in this FIG. 2B, resistor 220 is connected to transmission line 210 through via 265, which is referred to as a "signal via" because one end of via 265 is connected to transmission line 210 carrying electrical signals. Resistor 220 is also connected to power source 230 through via 275, which is referred to as a "power via" because one end of via 275 is connected to power source 230. In one embodiment, a set of via 265, resistor 220, and via 275 acts as a termination circuit for a processor, e.g., processor 120, when this processor is removed from system 100. Further, a PCB being part of a printed-circuit assembly (PCA) includes a plurality of sets of termination circuits. The PCA is in turns a thick land grid array (LGA) device to be connected to system 100.

Figure 2C:
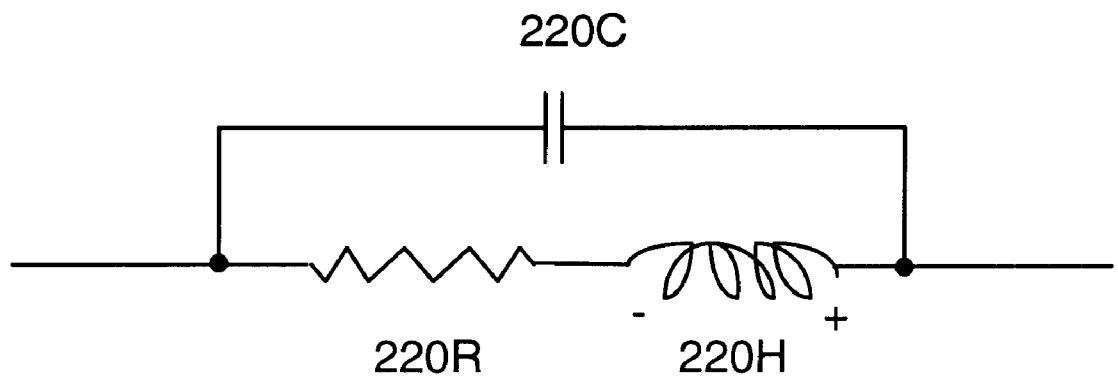
FIG. 2C shows a first impedance model for resistor 220 in FIG. 2B.
Figure 2D:
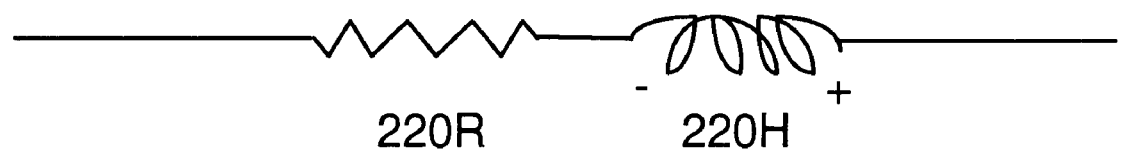
FIG. 2D shows a second impedance model for resistor 220 in FIG. 2B.

FIGS. 2C and 2D show two electrical-impedance models 200C and 200D of resistor 220 in circuit 200B. 220R is a resistor having the same value as resistor 220, 220C is a capacitor, and 220H is an inductor. As compared to model 200C, model 200D does not include capacitor 220C, and is normally used for simplification when 220C is less than 220H.

Figure 2E:
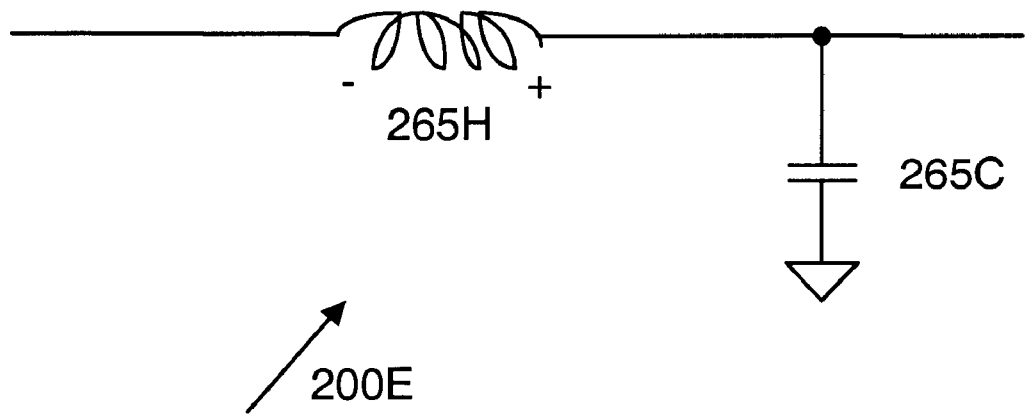
FIG. 2E shows a first impedance model for a via in FIG. 2B.
Figure 2F:
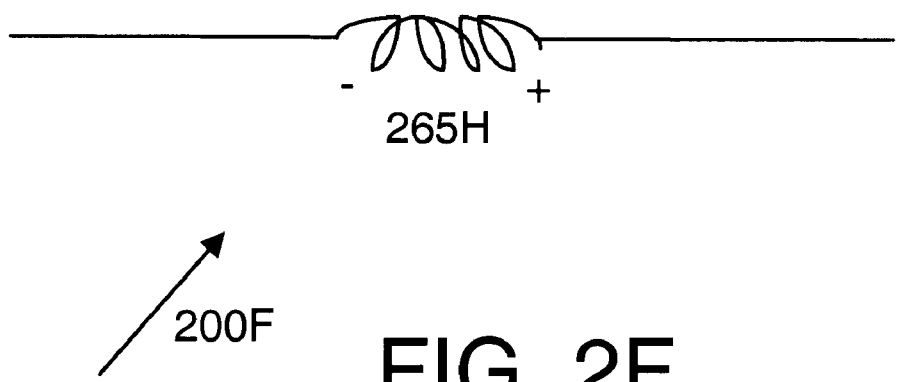
FIG. 2F shows a second impedance model for a via in FIG. 2B.

FIGS. 2E and 2F show two electrical-impedance models 200E and 200F of a signal via 265. 265H is an inductor while 265C is a capacitor. As compared to model 200E, model 200F does not include capacitor 265C, and is normally used for simplification when 265C is less than 265H. Models 200E and 200F are also applicable for different types of via, e.g., a power via 275. For illustration purposes, the inductor and capacitor associated with a via are named by adding the letter "H" and "C," respectively, to the number of the via. For example, for a power via 275, the associated inductor and capacitor are 275H and 275C, respectively.

The inductors and capacitors in models 200C, 200D, 200E, and 200F are commonly referred to as parasitic inductors and capacitors. The value of these inductors and capacitors varies depending on various factors including, for example, the length of resistor 220, the material of the vias and the PCB on which resistors 220 are placed, etc.

Figure 3:
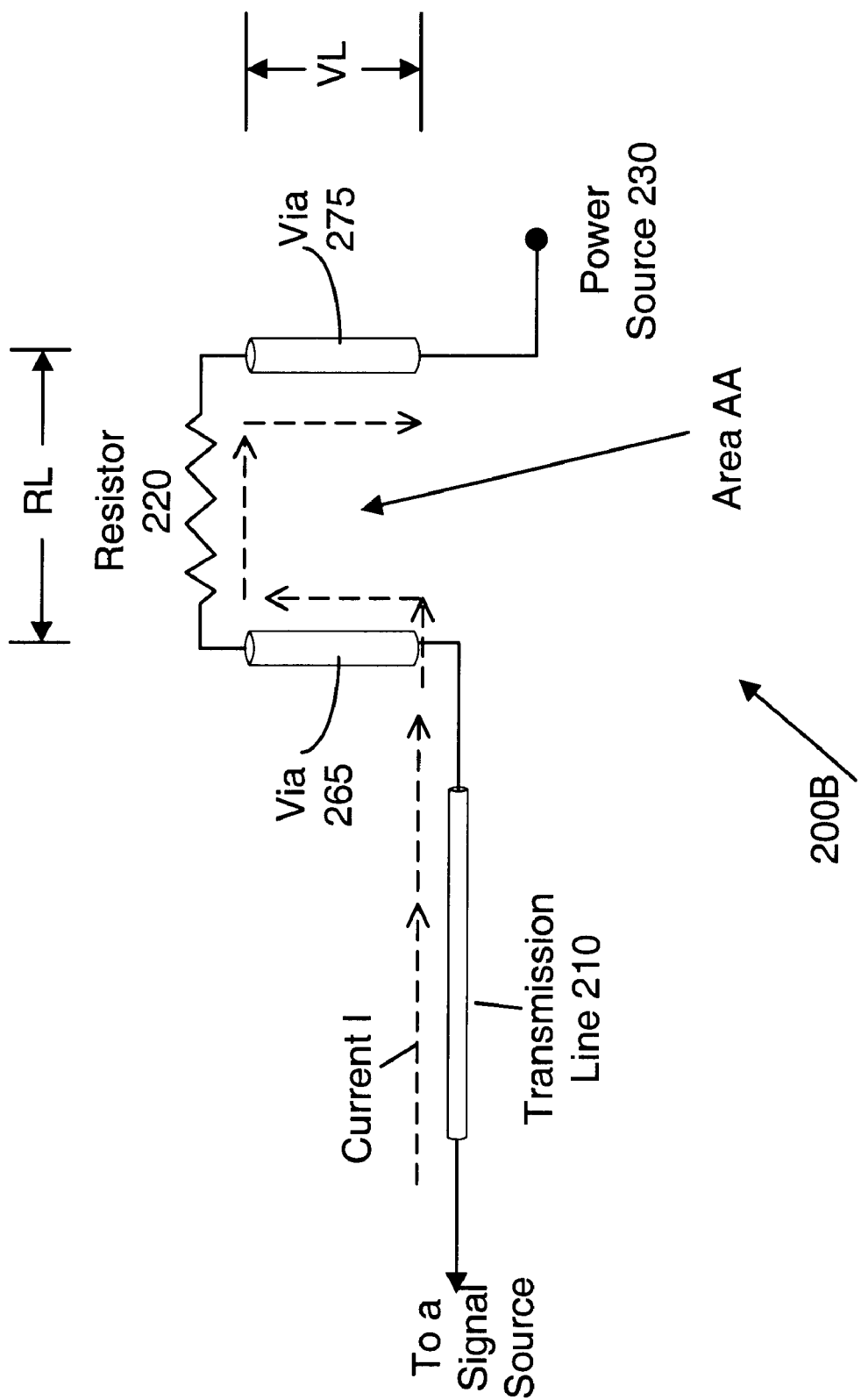
FIG. 3 is used to illustrate the impedance effects on a current flowing through circuit 200B in FIG. 2B.

FIG. 3 is used to illustrate the impedance effects on a current I flowing through circuit 200B of FIG. 2B. The dotted-and-arrowed line depicts the flow of current I. Current I flows from a signal source through transmission line 210, via 265, resistor 220, via 275, and power source 230. Current I seeks to return to the signal source driver (not shown) through power source 230 and ground. For simplification, current I is affected by an inductor L being the sum of inductors 265H, 220H, and 275H. In one embodiment, inductor L is proportionate to a rectangular area AA having one side as the length RL of resistor 220 and the other side as the length VL of a via, e.g., via 265 or 275. In one embodiment, RL is 0.5" while VL is 0.125", which is also the thickness of the PCB including the vias.

Creating Capacitors

Figure 4A:
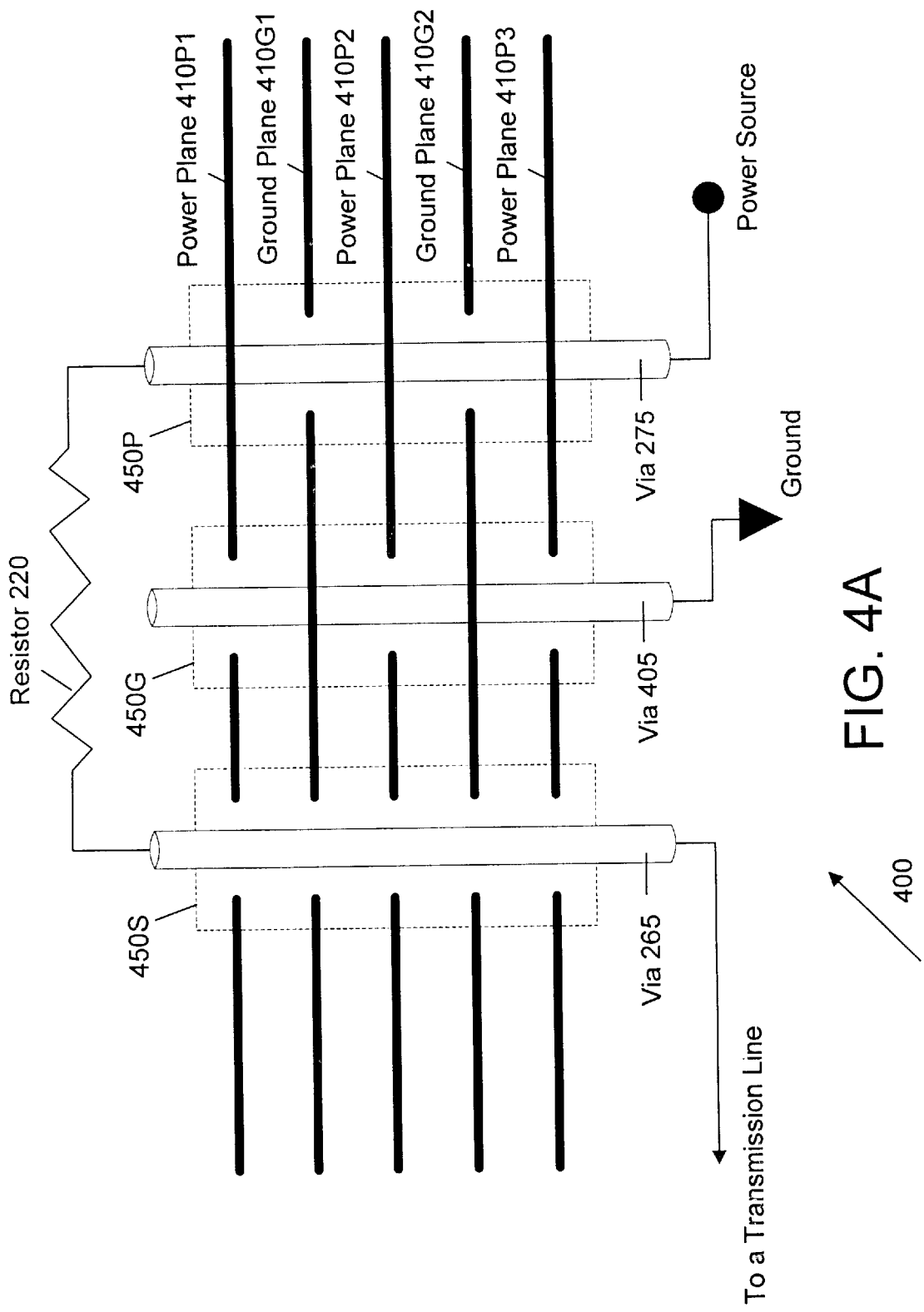
FIG. 4A shows a side view of a printed-circuit board to illustrate the creation of capacitors in accordance with one embodiment.

FIG. 4A shows a side view of a printed-circuit board 400 to illustrate the creation of various capacitors in accordance with one embodiment. Board 400 includes via 265, via 275, via 405, and alternating power and ground planes 410P1, 410G1, 410P2, 410G2, and 410P3. Via 405 is referred to as a ground via because via 405 is connected to an electrical ground node. A power plane 410P is connected to an electrical power source while a ground plane 410G is connected to a ground node. In one embodiment, each power via 275 is connected to each power plane 410P while each ground via 405 is connected to each ground plane 410G. Two ends of resistor 220 are connected to two vias 265 and 275. Normally, resistor 220 is parallel to power and ground planes. FIG. 4A is shown only as an example, the techniques disclosed herein may be used in situations where there are more than one via for each type of signal via, power via, and ground via. Further, the number of connections between a power via and power planes 410P, and between a ground via and ground planes 410G varies.

In various embodiments, different types of capacitors are formed in board 400, including capacitors formed between a pair of a power plane surface and a ground plane surface, between the power plane surfaces and a via, and between the ground plane surfaces and a via. The number of power and ground planes in board 400 and the distance between a power plane 410P to a ground plane 410G varies depending on the length of the vias, which, in one embodiment, is also the thickness of board 400. The capacitance value of the capacitors varies depending the material used in the vias, the surfaces of the planes, and the distance between the planes, etc. In one embodiment, the capacitance of several pairs of power and ground planes is calculated based on the equation $$C = n \times K_e A / l,$$

where C is the capacitance, n is the number of pairs of ground and power planes, A is the area of each plane, l is the distance between each plane, and $K_e$ is the dielectric constant of the material of the PCB.

FIG. 4B shows portion 450S in FIG. 4A to illustrate the formation of different types of capacitors with respect to a signal via, e.g., via 265. Each power plane 410P has an upper surface and a lower surface shown as 410P1-U, 410P1-L, 410P2-U, 410P2-L, 410P3-U, and 410P3L for power planes 410P1, 410P2, and 410P3. Similarly, each ground plane 410G has an upper surface and a lower surface shown as 410G1-U, 410G1L, 410G2-U, and 410G2-L for ground planes 410G1 and 410G2. Capacitors 430-1, 430-2, 430-3, and 430-4 are formed between power and ground plane surfaces. In one embodiment, capacitors 430 are distributed capacitors, i.e., the capacitance of the capacitor is usually evenly distributed in the area covered by the surfaces forming the capacitors. Because capacitors 430 are distributed, each capacitor 430-1, 430-2, 430-3, and 430-4 is shown at a location for illustrative purpose only. The distributed capacitance exists at appropriate surfaces, which is shown with capacitors having dotted lines. For example, the capacitance of capacitor 430-1 is distributed between lower surface 410P1-L of power plane 410P1 and upper surface 410G1-U of ground plane 410G1, the capacitance of capacitor 430-2 is distributed between lower surface 410G1-L of ground plane 410G1 and upper surface 410P2-U of power plane 410P2, etc.

In one embodiment, power planes 410P and ground planes 410G are separated from signal vias by some space or gaps, from which capacitors 440 are formed. In this FIG. 4B example, capacitors 440-1U, 440-2U, 440-3U, 4404U, and 440-5U are formed between via 265 and upper surfaces 410P1-U, 410G1-U, 410P2-U, 410G2-U, and 410P3-U, respectively. Capacitors 440-1L, 440-2L, 440-3L, 440-4L, 440-5L are formed between via 265 and lower surfaces 410P1-L, 410G1-L, 410P2-L, 410G2-L, and 410P3-L, respectively. Capacitors 440 with dotted lines are shown to illustrate that the capacitance is distributed at those capacitors' locations.

In one embodiment, board 400 includes twenty power planes 410P and twenty ground planes 410G with a standard, epoxy-fiberglass material FR4. One ground via 405 is used for every four signal vias 165, and one power via 175 is for one signal via 165. Resistors 220 used in board 400 are a 42.2 Ohm plus and minus 1% package, and a capacitor 430 is about 18 nF.

FIG. 4C shows portion 450P of FIG. 4A to illustrate the formation of capacitors with respect to a power via, e.g., via 275. In one embodiment, each power via 275 is connected to each power plane 410P, and therefore capacitors are not formed between the surfaces of power planes 410P and power vias 275. However, capacitors 430-1, 430-2, 430-3, and 430-4 are formed between each pair of adjacent ground and power surfaces. Those skilled in the art will recognize that these distributed capacitors 430 are the same as distributed capacitors 430 in FIG. 4B. Capacitors 440-2UP and 440-4UP are formed between via 275 and upper surfaces 410G1-U and 410G2-U, respectively. Similarly, capacitors 440-2LP and 440-4LP are formed between via 275 and lower surfaces 410G1-L and 410G2-L, respectively.

Depending on how power planes 410P are connected to vias 275, inductor 275H may be considered as comprised by smaller inductors. In FIG. 4C, power planes 410P-1, 410-P2, and 410P-3 intersect via 275, and, therefore, inductor arising from via 275, e.g., inductor 275H, is considered as comprised by two inductors 275H1 and 275H2. The number of inductors comprising inductor 275H varies and depends on the number of power planes in board 400.

Figure 4D:
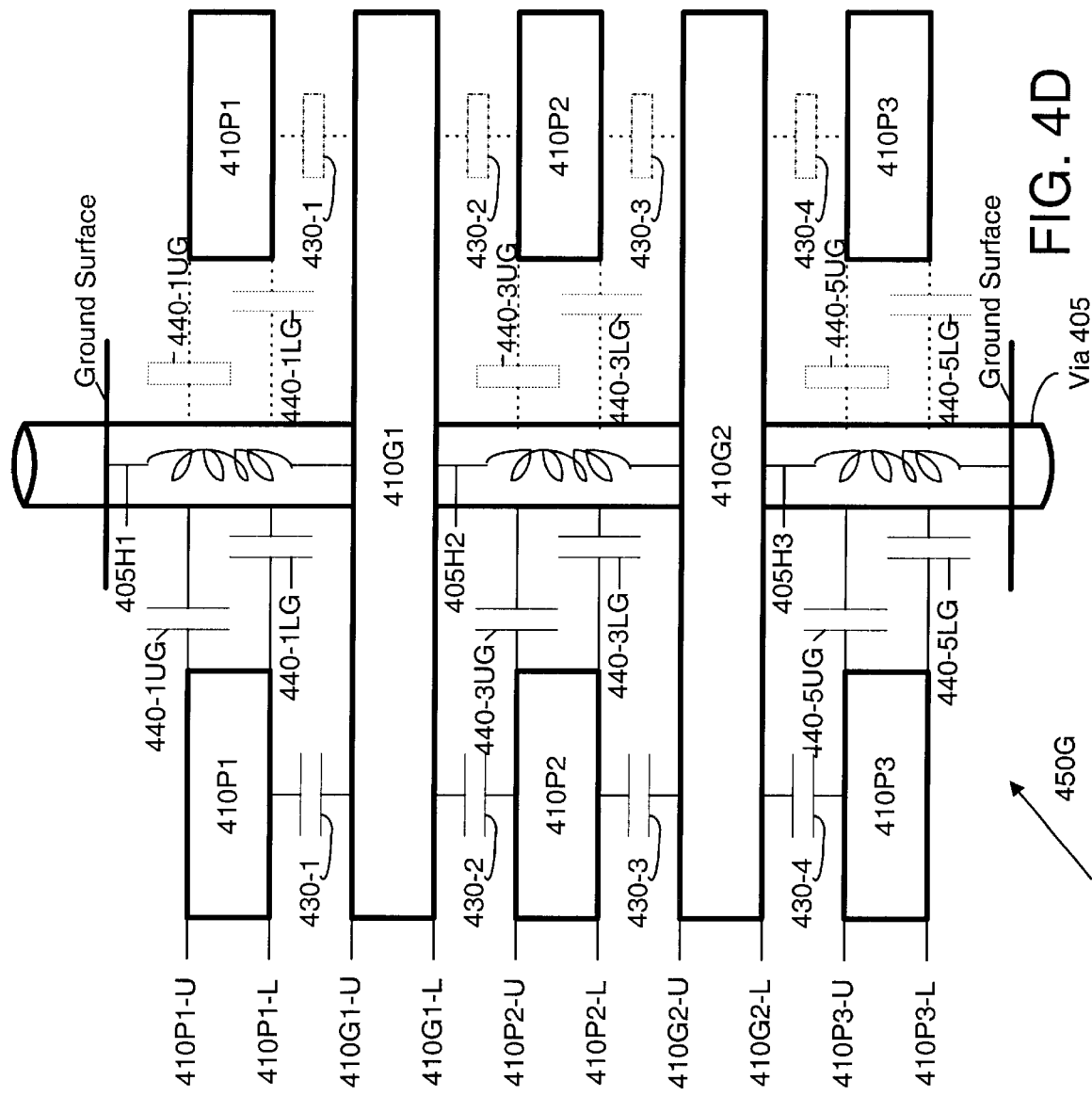
FIG. 4D shows a portion 450G of the printed-circuit board in FIG. 4A.

FIG. 4D shows portion 450G of FIG. 4A to illustrate the formation of capacitors with respect to a ground via, e.g., via 405. In one embodiment, each ground via 405 is connected to each ground plane 410G, and therefore capacitors are not formed between the surfaces of ground planes 410G and ground vias 405. However, capacitors 430-1, 430-2, 430-3, and 430-4 are formed between each pair of adjacent ground and power surfaces. These distributed capacitors 430 are the same distributed capacitors 430 of FIGS. 4B and 4C. Capacitors 440-IUG, 440-3UG, and 440-5UG are formed between via 405 and surfaces 410P1-U, 410P2-U, and 410P3-U, respectively. Similarly, capacitors 410-1LG, 410-3LG, and 410-5LG are formed between via 405 and surfaces 410P1-L, 410P2-L, and 410P3-L, respectively.

In FIG. 4D, ground planes 410G-1, 410G-2, and 410G-3 intersect via 405, and, therefore, the inductor arising from via 405, e.g., inductor 405H is considered as comprised by three inductors 405H1, 405H2, and 405H3. The number of inductors comprising inductor 405H varies and depends on the number of ground planes in board 400.

In the above FIGS. 4A, 4B, 4C, and 4D, a pair of a power surface and a ground surface that creates a capacitor 430 may be referred to as a capacitor plate.

Improving the Circuit

Figure 5A:
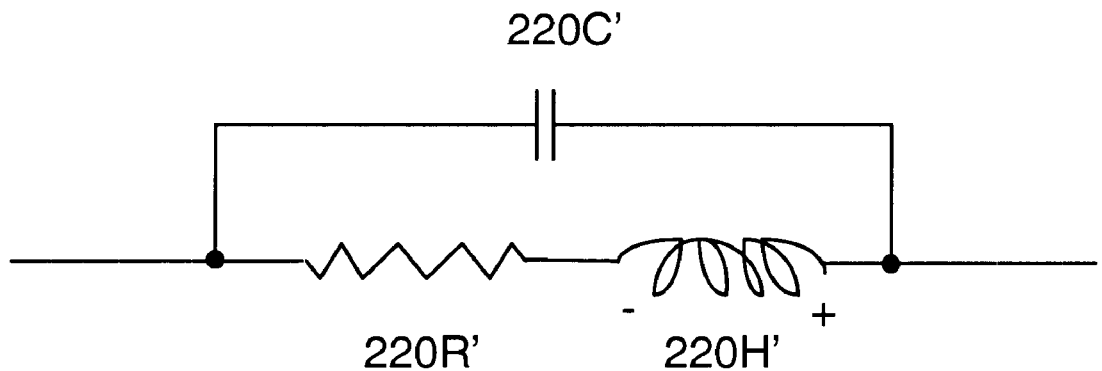
FIG. 5A shows an impedance model corresponding to the model in FIG. 2C, taking accounts of the created capacitors in FIGS. 4A–4D.
Figure 5B:
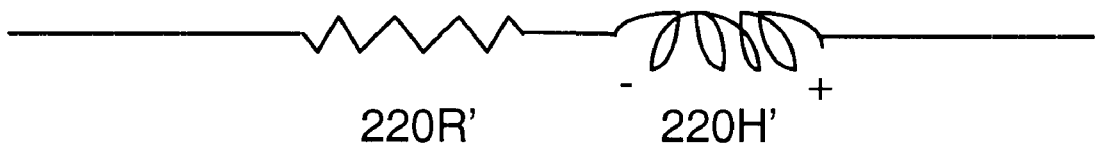
FIG. 5B shows an impedance model corresponding to the model in FIG. 2D, taking accounts of the created capacitors in FIGS. 4A–4D.

FIGS. 5A and 5B show two impedance models 500A and 500B of resistor 220 taking accounts of the above-created capacitors, in accordance with one embodiment. Models 500A and 500B are the same as models 200C and 200D, respectively, except that resistor 220R, inductor 220H, and capacitor 220C have been transformed to resistors 220R', inductor 220H', and capacitor 220C', respectively.

Figure 5C:
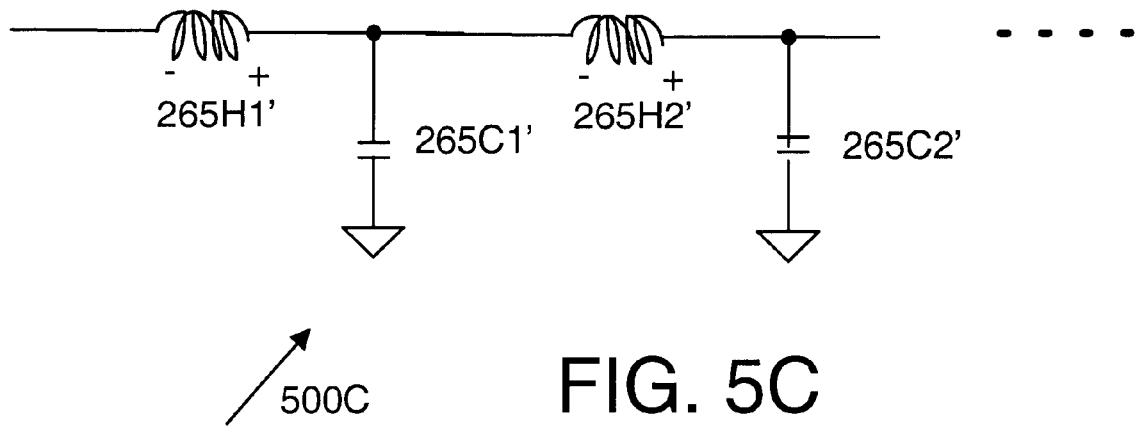
FIG. 5C shows an impedance model corresponding to the model in FIG. 2E, taking accounts of the created capacitors in FIGS. 4A–4D.

FIG. 5C shows an impedance model 500C corresponding to model 200E, taking accounts of the above-created capacitors, in accordance with one embodiment. In this model 500C, each capacitor plate corresponds to a set of inductor 265H' and capacitor 265C'. For example, if there are two plates, then there are two sets of inductor 265H' and capacitors 265C'; if there are N plates, then there are N sets of inductors 265H' and 265C'.

Figure 5D:
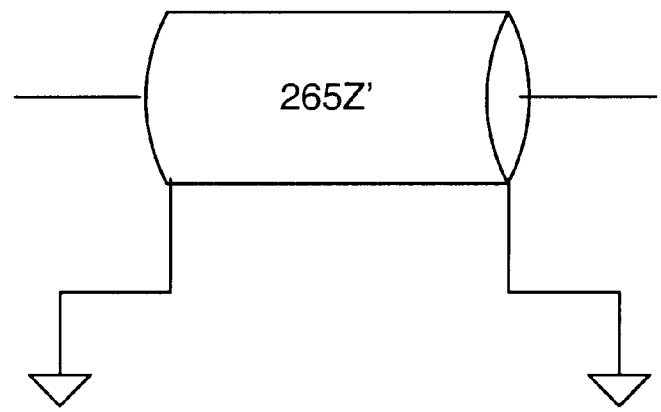
FIG. 5D shows an impedance model corresponding to the model in FIG. 2F, taking accounts of the created capacitors in FIGS. 4A–4D.

FIG. 5D shows an impedance model 500D corresponding to model 200F, taking accounts of the above-created capacitors, in accordance with one embodiment. In this model 500D, 265Z' is the effective impedance of a via 265 in a simplified transmission line model, and $$265Z'=\text{sqrt}\,(265H'/265C')$$

where 265H' is the total inductance of inductors 265H1', 265H2', . . . , 265HN', etc., and 265C' is the total capacitance of capacitors 265C1', 265C2', . . . , 265CN', etc.

In one embodiment, 265Z' can be tuned by changing the spacing between via 265 and power and ground planes. Further, it is desirable that 265Z' is as close to the effective impedance of resistor 220 as possible.

The capacitive and inductive relationships for a via to a series of power and ground planes is dependent on various factors including, for example, the geometries and spacing of the power and ground planes, etc. In one embodiment, approximations are done through a finite element analysis (FEA) package. In an alternative embodiment, the equations given by Howard Johnson and Martin Graham in *High Speed Digital Design, a Handbook of Black Magic,* ISBN 0133957241, are used.

The Smaller Current Loop

Figure 6:
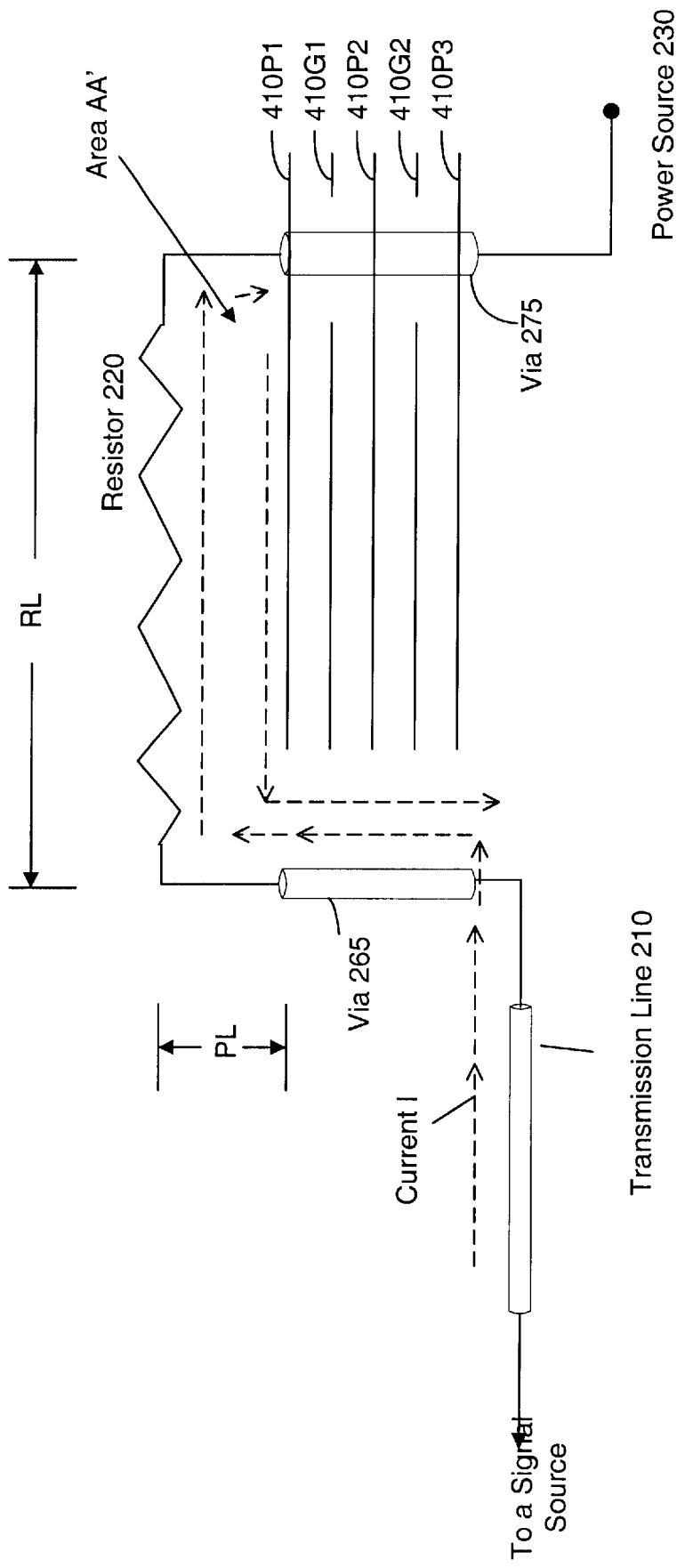
FIG. 6 shows the effective loop through which a current flows, taking accounts of the created capacitors in FIGS. 4A–4D.

FIG. 6 shows the effective loop through which current I flows taking accounts of the created capacitors, in accordance with one embodiment. FIG. 6 is the same as FIG. 2B with the addition of power and ground planes of FIG. 4A. For simplified illustration purposes, the created capacitors in FIGS. 4A–4D have transformed inductors 220H, 265H, and 275H to inductors 220H', 265H', and 275H', respectively. Current I flowing through via 265, resistor 220, via 275, and power source 230 is affected by inductor L', which is the sum of inductors 220H', 265H', and 275H'. In one aspect, inductor L' is proportionate to rectangular AA' and other paths through which current I flows. Rectangular AA's is defined by length RL of resistor 220 as one side and length PL as the other side. Length PL is the distance from resistor 220 to power plane 410P1.

In one embodiment, length PL is 0.01", length RL is 0.5". Consequently, rectangular AA' is (0.01"×0.5"): Therefore:

$$AA'/AA=(0.01\times0.5)/(0.125\times0.5)\sim1/10.$$

As a result:

220H'~220H/10

265H'~265H/10

275H'~275H/10

L'~L/10

Other Effects

In one embodiment, the returned current I flows through power and ground vias when an intermediate amount of capacitance is created in board 400. In this situation, current I passes through a power via or a ground via closest to resistor 220. However, as the capacitance increases, current I tends to move closer to a signal via 265.

The created capacitors in FIGS. 4A–4D also allow current I to pass through ground vias and ground planes, and effectively decreases the effective loop or paths through which current I flows. Without these capacitors, current I tends to spread away from signal vias, making the loop bigger or the paths longer. The bigger the capacitors are created, the smaller the loop is, or the shorter paths for current I to travel. When the capacitors are created, electrons are stored on the capacitors' surfaces, and these electrons are brought into current I as desired. Since the capacitors' surfaces are near signal via 265 which carries the signal, the electrons when brought into current I do not have to travel a long distance. Without the created capacitors the electrons are brought from a distant source, such as power source 230. Normally, current I seeks to return on paths having the least impedance. The created capacitors serve as the path with low impedance. The bigger the capacitors, the lower the impedance is for the returned path to ground.

The created capacitors both reduce inductance L and impedance that result from power-ground discontinuity due to different power-ground references of the signal carrying current I. The impedance due to power-ground discontinuity is reduced because the returned current I can flow through the created capacitors to ground.

The Current Paths

Figure 7:
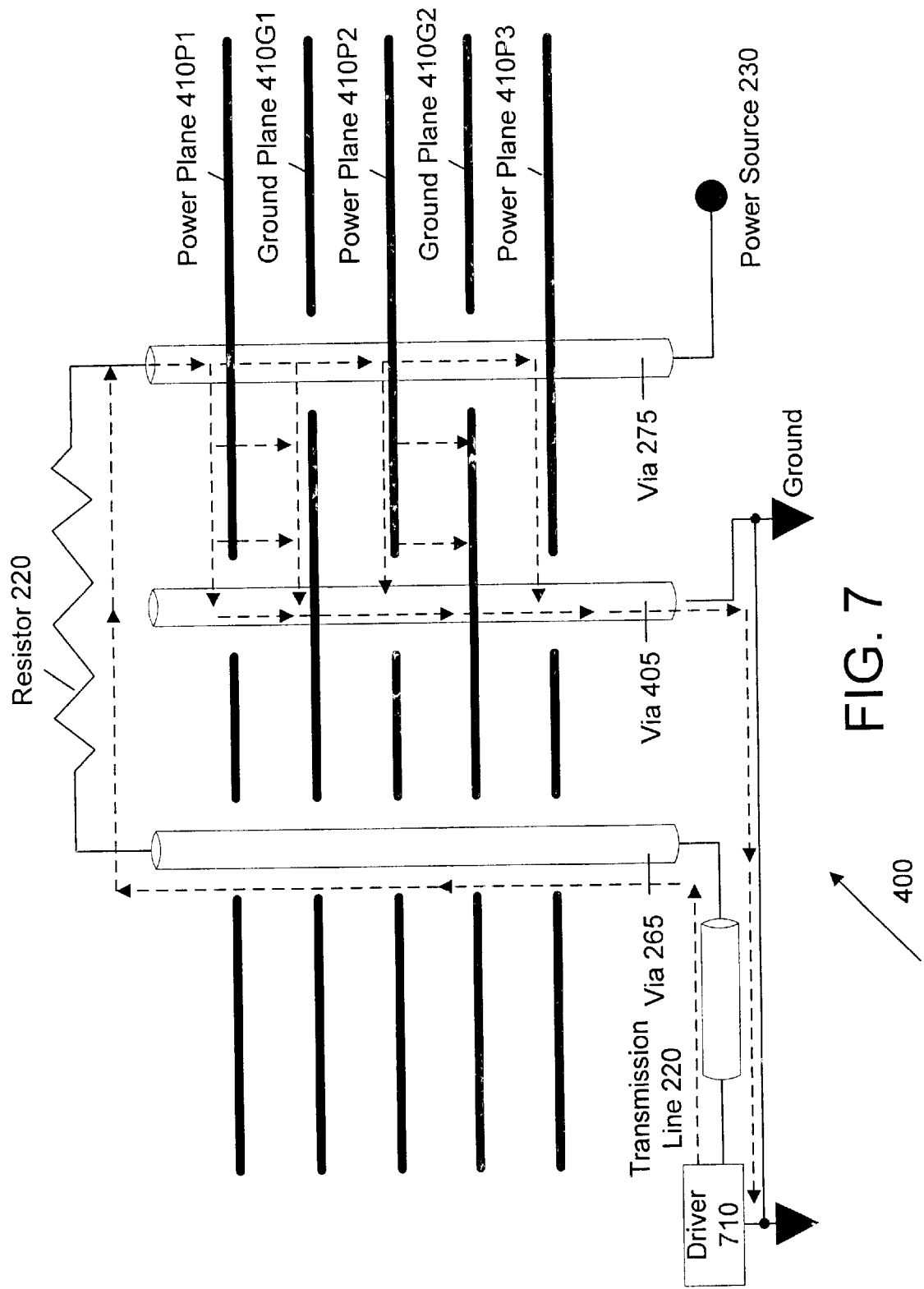
FIG. 7 shows the board of FIG. 4A in which a current flows through various paths.

FIG. 7 shows board 400 having current I flowing through various paths. The dotted-and-arrowed lines depict the current flow. Current I starts at driver 710 and travels through transmission line 210, signal via 265, resistor 210, and power via 275. From power via 275, current I, through various paths, seeks to return to driver 710, or ground. At high frequencies, the capacitors illustrated in FIGS. 4A, 4B, 4C, and 4D act as electrical "shorts" and thus allow current I to flow through them. As a result, current I flows through the vias and capacitors and travels through smaller loops than without the capacitors. As the loops are small, current I perceives low inductance paths, which, reduces the effects of the inductance that normally would cause electrical spikes and crosstalk. In this FIG. 7 illustration, some few paths are shown. However, current I flows from the power nodes, e.g., power vias, power planes, power sources, etc., through the capacitors to ground nodes, e.g., ground vias, ground planes, etc., as appropriate.

Benefits of the Invention

In various embodiments, board 400 operates as a low-cost, removable termination in processor systems, e.g., system 100. Using the construction of board 400 as a terminator eliminates most transient noise and reflections from the end of a processor removed from system 100. Board 400 also allows the processors still on the system to operate at high frequency when the other terminating processor is not loaded. For example, processor 110 can run at high frequency when processor 120 is removed and a resistor 220, a signal via 265, and a power via 275 in board 400 are used as a termination circuit for system 100. Similarly, processor 120 can run at high frequency when processor 110 is removed, etc. Board 400 has lower stray impedance and hence allows a wide frequency response. This is because the large distributed capacitance from capacitor 430 and low inductance construction greatly improves the electrical characteristics and allows for a higher maximum operating frequency of bus 115 and 125.

In the foregoing specification, the invention has been described with reference to specific embodiments thereof. However, it will be evident that various modifications and changes may be made thereto without departing from the broader spirit and scope of the invention. For example, power and ground planes may not be completely parallel to each other, and they may not be completely perpendicular to the vias. Some deviations are acceptable. Other resistive or electronic components may be used in place of resistor 220, etc. Accordingly, the specification and drawings are to be regarded as illustrative rather than as restrictive.

What is claimed is:

1. A method for effecting electrical impedance, comprising:

placing a first power plane substantially parallel to a first ground plane; wherein the first power plane is connected to a power source and the first ground plane is connected to a ground node;

placing one or more pieces of material substantially perpendicular to the first power plane and the first ground plane; wherein a piece of material of the one or more pieces of material carries electrical signals distinguishable from power carried by the first power plane; and forming capacitance in at least one of the following ways between the first power plane and the first ground plane;

between the first power plane and the piece of material of the one or more pieces of material; and between the first ground plane and the piece of material of the one or more pieces of material.

2. The method of claim 1 further comprises the step of placing at least one additional plane substantially parallel to the first power plane wherein an additional plane is selected from a group consisting of a power plane and a ground plane.

3. The method of claim 2 wherein the first power plane, the first ground plane and the at least one additional plane comprise alternating power and ground planes.

4. The method of claim 1 wherein the pieces of material include one or more power pieces connected to the power source.

5. The method of claim 4 wherein the first power plane is connected to at least one power piece.

6. The method of claim 1 wherein the pieces of material include one or more ground pieces connected to the ground node.

7. The method of claim 6 wherein the first ground plane is connected to least one ground piece.

8. The method of claim 1 wherein the piece of material serves as a via in a printed-circuit board.

9. The method of claim 1 wherein the piece of material is for use with a resistive component in a termination circuit.

10. The method of claim 1 wherein the electrical impedance includes parasitic impedance of one or a combination of the piece of material and an electronic component used near the first power plane.

11. The method of claim 1 wherein the first power plane and the formed capacitance reduce impedance seen by a current flowing through the piece of material and an electronic component used near the first power plane.

12. The method of claim 11 wherein changing the size of an area formed by the length of the electronic component and the first power plane changes the impedance seen by the current.

13. The method of claim 1 wherein the formed capacitance performs one or a combination of the following tasks:
  effecting impedance of the piece of material,
  allowing a wide frequency response for signals flowing through the piece of material,
  effecting impedance of an electronic component used near the first power plane,
  dissipating a wide frequency for signals flowing through the electronic component used near the first power plane, and
  effecting impedance resulted from power-ground discontinuity of signals having the power source and the ground node as references.

14. A circuit comprising:
  an electronic component having a first end connected to a signal source and a second end connected to an electrical power source;
  a first power plane being close to the electronic component and connected to the electrical power source; wherein
    the length of the electronic component and the first power plane form an area; and
    changing the size of the area effects electrical impedance arising from the electronic component.

15. The circuit of claim 14 wherein the electrical impedance includes parasitic inductance.

16. The circuit of claim 14 further comprising at least one additional plane substantially parallel to the first power plane wherein an additional plane is selected from a group consisting of:
  a power plane, and
  a ground plane connected to a ground node.

17. The circuit of claim 16 wherein the first power plane and the at least one additional plane comprise alternating power and ground planes.

18. The circuit of claim 17 wherein capacitance formed from the alternating power and ground planes performs one or a combination of the following tasks:
  effecting the electrical impedance arising from the electronic component,
  dissipating a wide frequency for signals flowing through the electronic component, and
  effecting impedance resulted from power-ground discontinuity of signals having the power source and the ground node as references.

19. The circuit of claim 17 further comprising one or more pieces of material substantially perpendicular to the first power plane.

20. The circuit of claim 19 wherein a piece of material and a power plane form capacitance reducing impedance of the piece of material.

21. The circuit of claim 19 wherein a piece of material and a ground plane form capacitance reducing impedance of the piece of material.

22. The circuit of claim 19 wherein the pieces of material include at least one piece selected from a group consisting of:
  a piece connected to a signal source;
  a piece connected to the power source; and
  a piece connected to the ground node.

23. The circuit of claim 14 wherein the electronic component is a resistive component.

24. A method for effecting electrical impedance, comprising:
  placing power planes and ground planes substantially parallel to one another; the power planes are connected to a power source, the ground planes are connected to a ground node, and a power plane is alternating with a ground plane;
  placing one or more pieces of material substantially perpendicular to the power planes and the ground planes;
  forming capacitance in at least one of the following ways
    between at least one power plane and at least one ground plane;
    between at least one power plane and at least one piece of material; and
    between at least one ground plane and at least one piece of material;
  connecting a first end of a resistive component to a first end of a first piece of material;
  connecting a second end of the resistive component to a first end of a second piece of material;
  connecting a second end of the second piece of material to the power source; and
  connecting a first power plane to the second piece of material.

25. The method of claim 24 further comprising the step of connecting a first ground plane to a third piece of material.

26. The method of claim 25 further comprising the step of connecting a second end of the second piece of material to a signal line.

27. The method of claim 26 is for use in one or a combination of:
  matching impedance of the signal line and the resistive component; and
  matching the impedance of the signal line and impedance seen by the signal line; the impedance seen by the signal line representing impedance of an electronic component; and
  terminating a signal carried on the signal line.

28. The method of claim 25 wherein the second piece of material and the third piece of material performs one or a combination of:
  effecting impedance arising from the first piece of material; and
  serving as a return current path for a signal carried on the first piece of material.

* * * * *